US009685576B2

(12) United States Patent
Webster

(10) Patent No.: US 9,685,576 B2
(45) Date of Patent: Jun. 20, 2017

(54) BACK SIDE ILLUMINATED IMAGE SENSOR WITH GUARD RING REGION REFLECTING STRUCTURE

(71) Applicant: OMNIVISION TECHNOLOGIES, INC., Santa Clara, CA (US)

(72) Inventor: Eric A. G. Webster, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 183 days.

(21) Appl. No.: 14/506,144

(22) Filed: Oct. 3, 2014

(65) Prior Publication Data

US 2016/0099371 A1    Apr. 7, 2016

(51) Int. Cl.
*H01L 31/00* (2006.01)
*H01L 21/00* (2006.01)
(Continued)

(52) U.S. Cl.
CPC ...... *H01L 31/1075* (2013.01); *H01L 27/1463* (2013.01); *H01L 27/1464* (2013.01);
(Continued)

(58) Field of Classification Search
CPC ......... H01L 31/02027; H01L 31/107–31/1075
See application file for complete search history.

(56) References Cited

U.S. PATENT DOCUMENTS 5,028,138 A    7/1991  Wolff
6,150,188 A    11/2000 Geusic et al.
(Continued)

FOREIGN PATENT DOCUMENTS

TW    200812078 A    3/2008
TW    200947685 A1   11/2009
(Continued)

OTHER PUBLICATIONS

TW Patent Application No. 103135567—Taiwanese Office Action and Search Report, issued Jan. 20, 2016, with English Translation (11 pages).
(Continued)

*Primary Examiner* — Mary Wilczewski
*Assistant Examiner* — Tsz Chiu
(74) *Attorney, Agent, or Firm* — Blakely Sokoloff Taylor & Zafman LLP

(57) ABSTRACT

A photon detector includes a single photon avalanche diode (SPAD) disposed proximate to a front side of a semiconductor layer. The SPAD includes a multiplication junction that is reversed biased above a breakdown voltage such that light directed into the SPAD through a backside of the semiconductor layer triggers an avalanche multiplication process. A guard ring is disposed in a guard ring region that surrounds the SPAD to isolate the SPAD in the semiconductor layer. A guard ring region reflecting structure is disposed in the guard ring region proximate to the guard ring and proximate to the front side of the semiconductor layer such that light directed into the guard ring region through the backside of the semiconductor layer that bypasses the SPAD is redirected by the guard ring region reflecting structure back into the semiconductor layer and into the SPAD.

15 Claims, 5 Drawing Sheets

(51) Int. Cl.
| | |
|---|---|
| *H01L 31/0232* | (2014.01) |
| *H01L 31/18* | (2006.01) |
| *H01J 40/14* | (2006.01) |
| *H01L 31/107* | (2006.01) |
| *H01L 31/02* | (2006.01) |
| *H01L 27/146* | (2006.01) |
| *H04N 5/33* | (2006.01) |
| *H04N 5/369* | (2011.01) |

(52) U.S. Cl.
CPC .. *H01L 27/14609* (2013.01); *H01L 27/14634* (2013.01); *H01L 27/14636* (2013.01); *H01L 27/14643* (2013.01); *H01L 31/02027* (2013.01); *H01L 31/02327* (2013.01); *H04N 5/332* (2013.01); *H04N 5/369* (2013.01); *H01L 27/1465* (2013.01)

(56) References Cited

U.S. PATENT DOCUMENTS

| | | | |
|---|---|---|---|
| 6,154,551 A | 11/2000 | Frenkel | |
| 6,737,626 B1* | 5/2004 | Bidermann | H01L 27/14609 250/208.1 |
| 6,850,216 B2 | 2/2005 | Akimoto et al. | |
| 7,262,402 B2* | 8/2007 | Niclass | H01L 31/107 250/208.1 |
| 7,511,750 B2* | 3/2009 | Murakami | H01L 27/1462 348/272 |
| 7,982,177 B2* | 7/2011 | Nozaki | H01L 27/14625 250/239 |
| 8,259,293 B2* | 9/2012 | Andreou | H01L 27/14603 356/222 |
| 8,535,807 B2 | 9/2013 | Kurihara | |
| 8,628,990 B1 | 1/2014 | Wu et al. | |
| 2004/0147068 A1 | 7/2004 | Toyoda et al. | |
| 2004/0251395 A1* | 12/2004 | Takahashi | H01L 27/14623 250/208.1 |
| 2006/0192083 A1* | 8/2006 | Fu | H01L 27/1462 250/214.1 |
| 2007/0284686 A1 | 12/2007 | Liu et al. | |
| 2009/0200625 A1 | 8/2009 | Venezia et al. | |
| 2009/0315135 A1* | 12/2009 | Finkelstein | H01L 31/107 257/438 |
| 2010/0220226 A1 | 9/2010 | Wang et al. | |
| 2010/0285630 A1 | 11/2010 | Lee | |
| 2011/0266645 A1 | 11/2011 | Chao | |
| 2012/0313205 A1 | 12/2012 | Haddad et al. | |
| 2012/0319242 A1 | 12/2012 | Mao et al. | |
| 2014/0077323 A1 | 3/2014 | Velichko et al. | |
| 2014/0131779 A1 | 5/2014 | Takeda | |
| 2014/0132812 A1* | 5/2014 | Soda | H01L 27/14629 348/302 |
| 2014/0197509 A1 | 7/2014 | Haddad et al. | |
| 2014/0291481 A1 | 10/2014 | Zhang et al. | |
| 2014/0361347 A1* | 12/2014 | Kao | H01L 27/14687 257/226 |
| 2015/0340391 A1 | 11/2015 | Webster | |

FOREIGN PATENT DOCUMENTS

| | | |
|---|---|---|
| TW | 201140128 A1 | 11/2011 |
| TW | 201301439 A1 | 1/2013 |
| TW | 201413924 A | 4/2014 |
| WO | WO 2012/032353 A2 | 3/2012 |

OTHER PUBLICATIONS

U.S. Appl. No. 14/286,478—Non-Final Office Action, mailed Mar. 25, 2016, pp. 1-38.
U.S. Appl. No. 14/286,478—Final Office Action, mailed Dec. 4, 2015, pp. 1-39.
U.S. Appl. No. 14/286,478—Non-Final Office Action, mailed Jun. 25, 2015, pp. 1-28.
U.S. Appl. No. 14/286,478, filed May 23, 2014, Webster.
Tournier, A. et al., "Pixel-to-Pixel Isolation by Deep Trench Technology: Application to CMOS Image Sensor," Proc. IISW, 2011, pp. 12-15.
Shinohara, T. et al., "Three-dimensional Structures for High Saturation Signals and Crosstalk Suppression in 1.20 μm Pixel Back-Illuminated CMOS Image Sensor," Electron Devices Meeting (IEDM), 2013 IEEE International, pp. 27.4.1-27.4.4.
Ahn, J. et al., "A 1/4-inch 8Mpixel CMOS Image Sensor with 3D Backside-Illuminated 1.12μm Pixel with Front-Side Deep-Trench Isolation and Vertical Transfer Gate," ISSCC 2014: Session 7: Image Sensors: 7.1, 2014 IEEE International Solid-State Circuits Conference, Digest of Technical Papers, pp. 124-126.
"Optical Properties of Silicon" (n.d.), PVEducation, 4 pages. Retrieved May 23, 2014 from: http://pveducation.org/pvcdrom/materials/optical-properties-of-silicon.
"Total internal reflection" (n.d.), Wikipedia: the free encyclopedia, 7 pages. Retrieved May 23, 2014 from: http://en.wikipedia.org/wiki/Total_internal_reflection.
U.S. Appl. No. 14/286,478—Final Office Action, mailed Aug. 26, 2016, pp. 1-39.
TW Patent Application No. 104132615—Taiwanese Office Action and Search Report, issued Aug. 30, 2016, with English Translation (18 pages).
U.S. Appl. No. 14/286,478—Non-Final Office Action, mailed Mar. 22, 2017, 45 pages.
TW Patent Application No. 104132615—Taiwanese Office Action, issued Jan. 23, 2017, with English Translation (5 pages).

* cited by examiner

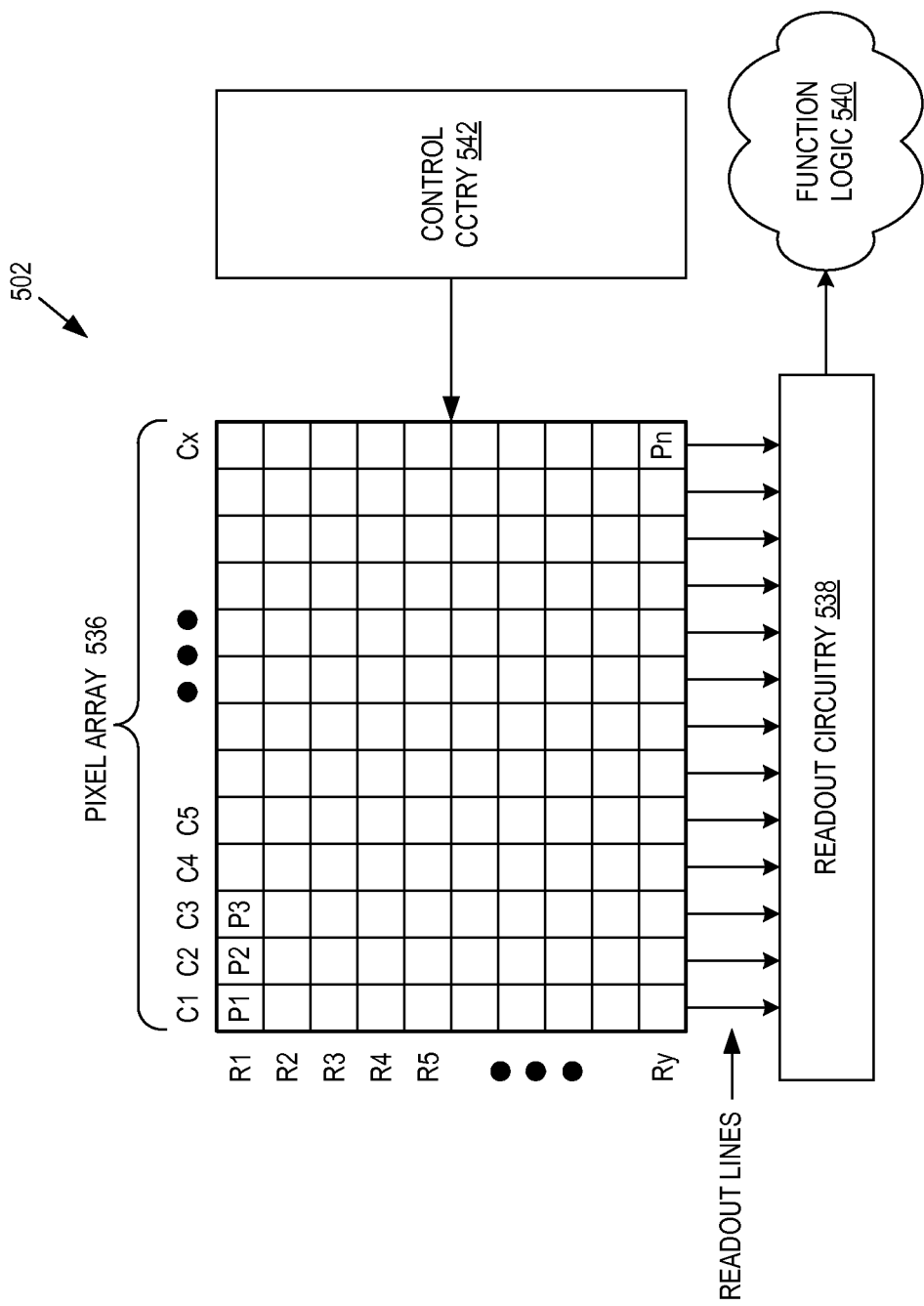

BACK SIDE ILLUMINATED IMAGE SENSOR WITH GUARD RING REGION REFLECTING STRUCTURE

BACKGROUND INFORMATION

Field of the Disclosure

The present invention relates generally to photodetectors, and more specifically, the present invention is directed to imaging systems including single photon avalanche diode imaging sensors.

Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

Two fields of applications in which size and image quality are particularly important are medical imaging and automotive applications. For these applications the image sensor chip must typically provide a high quality image in the visible light spectrum as well as have improved sensitivity in the infrared and near infrared portions of the light spectrum.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 5 is a block diagram showing one example of an integrated circuit system having an example SPAD imaging sensor system in accordance with the teachings of the present invention.

Figure 1:
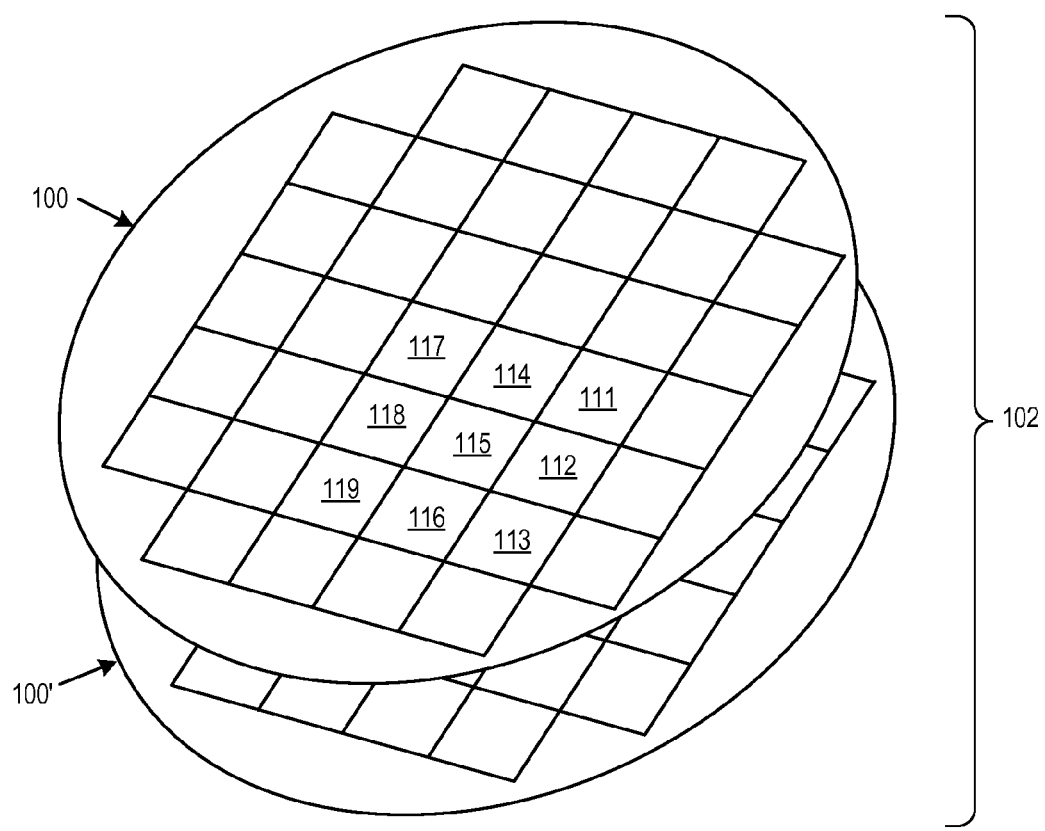
FIG. 1 is an exploded view of one example of stacked semiconductor device wafers with integrated circuit dies of an example single photon avalanche diode (SPAD) imaging sensor system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In a typical image sensor, a significant portion of the incident infrared or near infrared light may propagate through the semiconductor material, such as for example silicon, of the image sensor without being absorbed. In order to help increase the amount of infrared or near infrared light that is absorbed, thicker silicon is typically needed. However, there is a tradeoff because the semiconductor material of a typical image sensor is typically thinned in order to improve visible light performance, which degrades infrared or near infrared performance of the image sensor. An additional challenge that is presented with backside illuminated with photon detectors including single photon avalanche diodes (SPAD) is that the fill factor of SPAD imaging systems is not 100% due to the guard rings surrounding the SPADs occupying some of the available area in the semiconductor layers of the imaging sensors. The guard ring regions are not as sensitive to light and have poorer timing resolution than the high field p/n+ junctions of the SPADs.

Thus, as will be describe below, an example stacked chip imaging sensor system in accordance with the teaching of the present invention features backside illuminated SPADs with guard ring region reflecting structures disposed in guard ring regions in metal layers proximate to guard rings that surround the SPADs at the front side of the semiconductor layer such that light that is directed into the guard ring regions through the backside of the semiconductor layer that bypasses the SPADs is redirected by the guard ring region reflecting structures back into the semiconductor layer and into the SPADs for absorption by the SPADs in accordance with the teachings of the present invention.

To illustrate, FIG. 1 is an exploded view of stacked device wafers 100 and 100' that are to be bonded together to form one example of a stacked chip integrated circuit imaging sensor system 102 in accordance with the teachings of the present invention. Device wafers 100 and 100' may include silicon, gallium arsenide, or other suitable semiconductor materials. In the illustrated example, device wafer 100 includes semiconductor chips 111-119 while device wafer 100' includes corresponding semiconductor chips (view obscured in FIG. 1). As will be discussed in more detail below, in some examples, each chip 111-119 of device wafer 100 may be a pixel die including a pixel array of backside illuminated SPADs, with each SPAD surrounded by a guard ring, while each corresponding chip of device wafer 100' may be an application specific integrated circuit (ASIC) die with CMOS circuitry including for example an array of digital counter circuits and associated readout electronics that are fabricated using standard CMOS processes. The placement of counter circuits on the separate bottom device wafer 100' allows for a very high fill factor in the SPAD pixel array on the top device wafer 100. Furthermore, since device wafer 100 is formed separately from device wafer 100', custom fabrication processes may be utilized to optimize the formation of the SPAD regions in the SPAD pixel array on device wafer 100, while traditional CMOS processes may be retained when forming the CMOS circuitry on the device wafer 100' in accordance with the teachings of the present invention.

Figure 2:
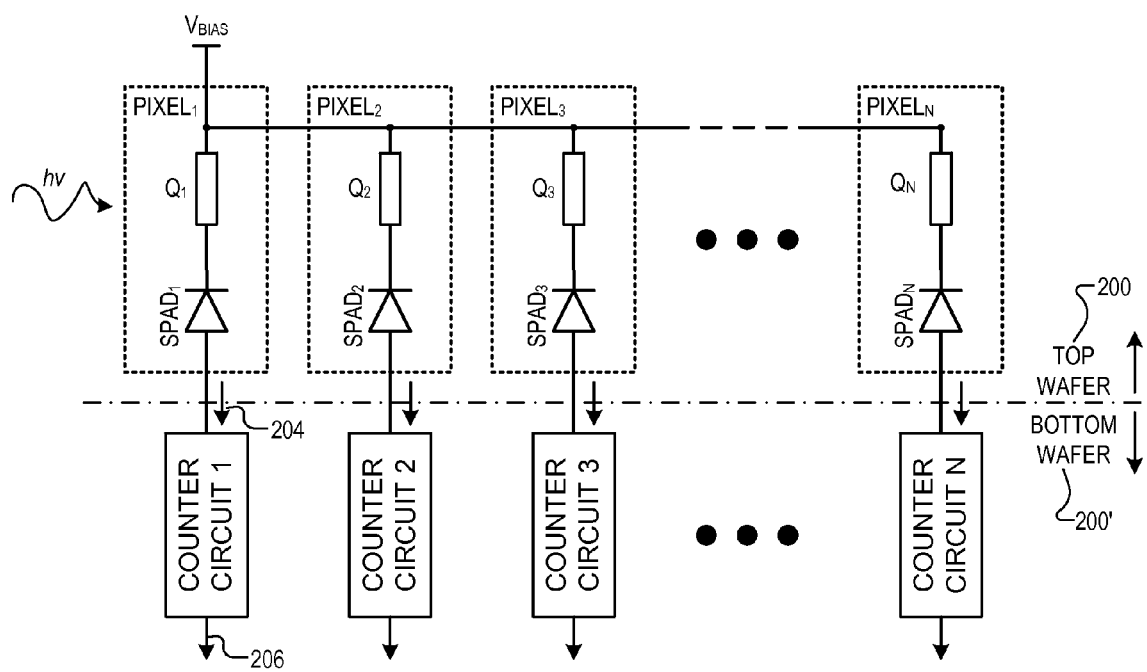
FIG. 2 is a circuit diagram illustrating one example of a stacked chip system including photon detectors with SPADs coupled to quenching elements and counter circuits in accordance with the teachings of the present invention.

FIG. 2 is a circuit diagram illustrating one example of stacked chip integrated circuit imaging sensor system 202 including a pixel array with photon detectors having SPADs coupled to quenching elements and counter circuits in accordance with the teachings of the present invention. It is noted that the pixel circuitry illustrated in FIG. 2 (e.g., $PIXEL_1$, $PIXEL_2$, ... $PIXEL_N$) is one possible example of a SPAD pixel circuitry architecture for implementing each pixel with a pixel array. In the example depicted in FIG. 2, pixels $PIXEL_1$ through $PIXEL_N$ are illustrated as being arranged in a single row. However, in other examples, it is appreciated that pixels of the pixel array may be arranged into a single column, or into a two-dimensional array of columns and rows.

As shown in the example, each example pixel includes a SPAD (e.g., $SPAD_1$-$SPAD_N$) coupled to a respective quenching element (e.g., quenching elements $Q_1$-$Q_N$) disposed in a top wafer 200 of a stacked chip system. In the illustrated example, and as will be discussed in further detail below, it is noted that each SPAD is illuminated through a backside of the semiconductor layer and is surrounded in the semiconductor layer by a guard ring to isolate the SPAD. In the example, a guard ring region reflecting structure is disposed in the metal layers proximate to the guard rings to deflect incident light into the SPAD regions for absorption in accordance with the teachings of the present invention. In various examples, it is also noted that the example quenching elements $Q_1$-$Q_N$ that are coupled to each respective $SPAD_1$-$SPAD_N$ may be included in the top wafer 200 or the bottom wafer 200' in accordance with the teachings of the present invention. It is also appreciated that example quenching elements $Q_1$-$Q_N$ may be implemented using passive or active quenching elements in accordance with the teachings of the present invention.

As shown in the example, there are N number of SPADs, N number of quenching elements, and N number of counter circuits (e.g., counter circuits 1-N). In the depicted example, the counter circuits 1-N are implemented using CMOS circuitry disposed on bottom wafer 200' fabricated using a standard CMOS process of the stacked chip system, and are electrically coupled to receive output pulses 204 generated by a respective SPAD in response to a received photon included in incident light. The counter circuits 1-N may be enabled to count the number of output pulses 204 generated by each respective SPAD during a window of time and to output a digital signal 206 that is representative of the count. Although the example depicted in FIG. 2 illustrates a direct connection between the pixel circuitry and the counter circuit, any connection between pixel circuitry and the counter circuit, including by way of AC coupling, may be utilized in accordance with the present teachings. Furthermore, any known SPAD bias polarity and/or orientation may be implemented. In one example, each counter circuit includes an amplifier to amplify the received output pulse 204. Alternately, or in addition to counter circuits, timing circuitry can be place in each pixel/column/array to time the arrival of incident photons.

In the illustrated example, each $SPAD_1$-$SPAD_N$ is reverse biased via a bias voltage $V_{BIAS}$ that is above the breakdown voltage of each $SPAD_1$-$SPAD_N$. In response to a single photogenerated carrier from incident light, an avalanche multiplication process is triggered that causes an avalanche current at the output of each $SPAD_1$-$SPAD_N$. This avalanche current self-quenches in response to a voltage drop that is developed across the quenching element (e.g., $Q_1$-$Q_N$), which causes the bias voltage across the SPAD to drop. After the quenching of the avalanche current, the voltage across the SPAD recovers to above the bias voltage and then the SPAD is ready to be triggered again. The resulting output pulse 204 of each $SPAD_1$-$SPAD_N$ is received by a respective counter circuit 1-N, which increments its count in response thereto.

Conventional SPAD designs that incorporate SPADs on the same chips as the CMOS digital counters fabricated using a standard CMOS process suffer from reduced fill factor on the imaging plane due to the area occupied by the CMOS circuits themselves. Accordingly, one advantage of implementing a stacked chip structure in accordance with the teachings of the present invention is that with the SPADs on the top chip and with the CMOS circuitry on a separate bottom chip, the fill factor of the SPAD imaging array on the top chip does not need to be reduced in order to provide room to accommodate the CMOS circuitry on the same chip in accordance with the teachings of the present invention.

It is noted that the circuit diagram of FIG. 2 is provided herewith for explanation purposes and that some circuit elements (e.g., passive components such as resistors and capacitors, and active components such as transistors) are not shown in detail so as not to obscure the teachings of the present invention. For example, the illustrated pixel circuitry of FIG. 2 may produce an output pulse that requires amplification prior to being sensed by the input of the digital counters. In another example, the connection at the node between quenching element $Q_1$ and $SPAD_1$ would be at a high voltage, which may require AC coupling.

Figure 3:
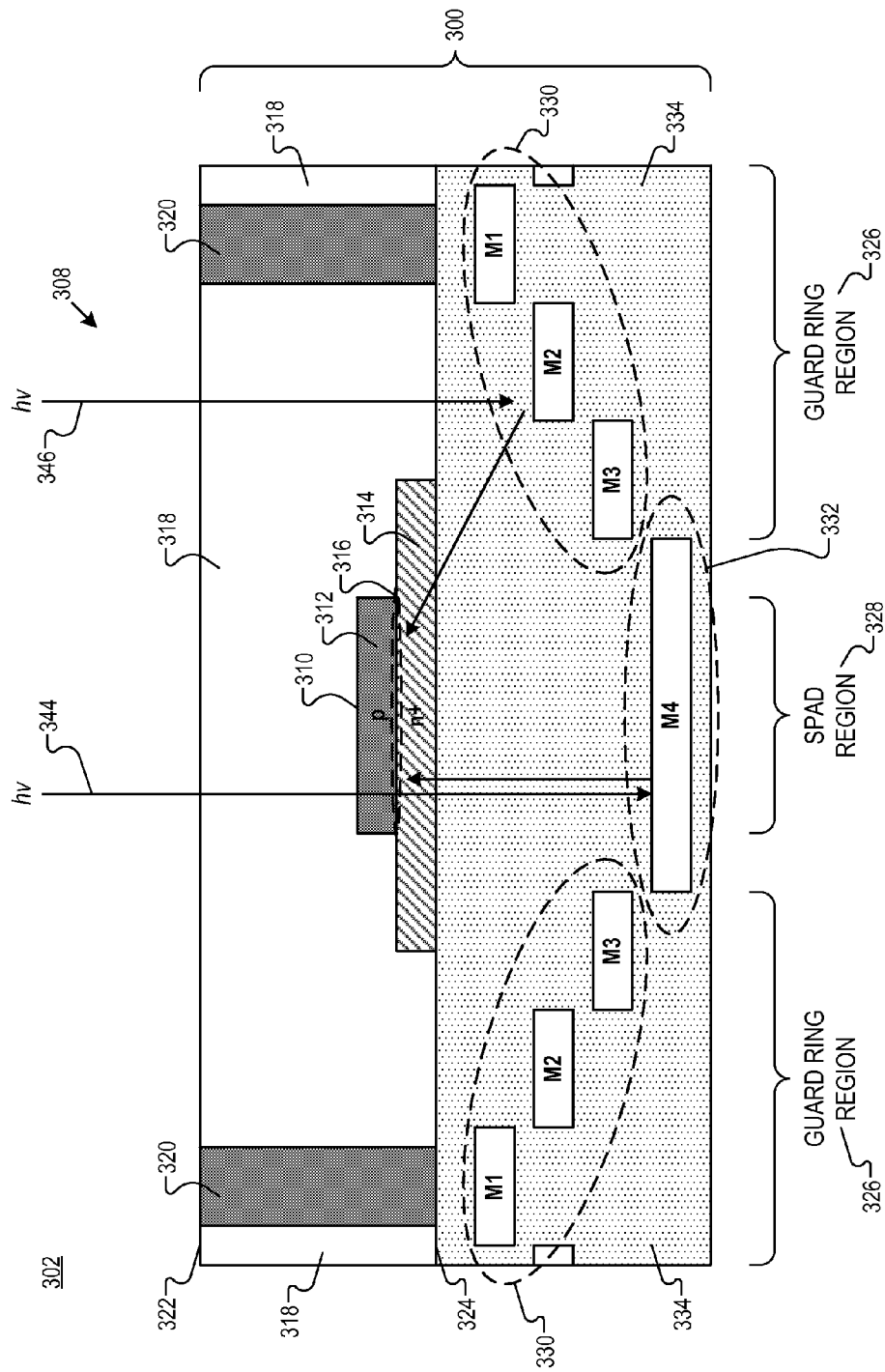
FIG. 3 is a cross-sectional view of one example of a photon detector implemented in a semiconductor device wafer of a stacked chip system including of a SPAD surrounded by a guard ring as well as an example guard ring region reflecting structure in addition to an example SPAD region reflecting structure included in metal layers of the semiconductor in accordance with the teachings of the present invention.

FIG. 3 is a cross-sectional view of one example of a portion of a semiconductor device wafer 300 of a stacked chip system 302 in accordance with the teachings of the present invention. It is appreciated that stacked chip system 302 and semiconductor device wafer 300 of FIG. 3 may be one example of an implementation of stacked chip system 102 and semiconductor device wafer 100 of FIG. 1 and/or stacked chip system 202 and semiconductor device wafer 200 of FIG. 2, and that similarly named and numbered elements referenced below are coupled and function similar to as described above. Thus, in one example, semiconductor device wafer 300 of FIG. 3 is stacked with another semiconductor device wafer, including for example, readout circuitry, etc., and that the semiconductor device wafer 300 and the other semiconductor device wafer including the readout circuitry, etc., are coupled together in a stacked chip system. It is also noted that various circuit elements of stacked chip system 202 shown in FIG. 2, such as for example quenching elements $Q_1$-$Q_N$ and/or counter circuits 1-N of FIG. 2 are not shown in detail in FIG. 3 so as not obscure the teachings of the present invention.

Referring back to the example depicted in FIG. 3, an example photon detector 308 is illustrated including a SPAD 310 disposed in a SPAD region 328 of semiconductor device wafer 300. As shown, the SPAD 310 is disposed proximate to a front side 324 of a semiconductor layer 318 of semiconductor device wafer 300 of stacked chip system 302. In one example, the semiconductor layer 318 includes a thinned silicon layer. The SPAD 310 includes a multiplication junction 316 defined at an interface between an n doped layer 314 and a p doped layer 312 of the SPAD 310 in the semiconductor layer 318. In the example, the multiplication junction 316 is reversed biased above a breakdown voltage such that light 344, which is directed into the SPAD 310 through a backside 322 of the semiconductor layer 318 triggers an avalanche multiplication process in the multiplication junction 316. In one example, light 344 includes infrared or near infrared light The example depicted in FIG. 3 also shows that a guard ring 320 is disposed in a guard ring region 326 of semiconductor device wafer 300. As shown, the guard ring 320 is disposed in first semiconductor layer 318 proximate to the SPAD 310, and surrounds the SPAD 310 to isolate the SPAD 310 in the semiconductor layer 318. In the example, the guard ring 320 extends through the semiconductor layer 318 from the front side 324 to the backside 322.

The example illustrated in FIG. 3 also shows a guard ring region reflecting structure 330 is disposed in the guard ring region 326 beneath, or proximate to, the guard ring 320. As shown in the example, the guard ring region reflecting structure 330 is disposed proximate to the front side 324 of the semiconductor layer 318 such that light 346, which is directed into the guard ring region 326 through the backside 322 of the semiconductor layer 318 that bypasses the SPAD 310 is redirected by the guard ring region reflecting structure 330 back into the semiconductor layer 318 and into the SPAD 310 in accordance with the teachings of the present invention. In one example, light 346 includes infrared near infrared light The example shown in FIG. 3 shows that there is a SPAD region reflecting structure 332 is disposed in a SPAD region 328 beneath, or proximate to, the SPAD 310. As shown in the example, the SPAD region reflecting structure 332 is proximate to the front side 324 of the semiconductor layer 318 such that light 344 directed into the semiconductor layer 318 through the backside 322 of the semiconductor layer 318 that passes through the SPAD 310 unabsorbed is reflected by the SPAD region reflecting structure 332 back into the semiconductor layer 318 and into the SPAD 310 in accordance with the teachings of the present invention.

As shown in the depicted example, the guard ring reflecting structure 330 and the SPAD region reflecting structure 332 are implemented using the metal layers M1, M2, M3, and M4 in an oxide material 334 of the semiconductor device wafer 300 proximate to the front side 324 of the semiconductor layer 318. In particular, the example shows that the guard ring reflecting structure 330 is implemented using a plurality of metal layers M1, M2, and M3 to redirect light 346 that is received in the guard ring region 326 back into the semiconductor layer 318 and into SPAD 310. It is appreciated that in other examples, that guard ring reflecting structure 330 may include a greater or fewer number of metal layers M1, M2, M3, and M4, so long as light 346 that is received in the guard ring region 326 that bypasses SPAD 310 is redirected back into the semiconductor layer 318 and into SPAD 310 in accordance with the teachings of the present invention. The example depicted in FIG. 3 also shows that the SPAD region reflecting structure 332 is implemented using one metal layers M4 in oxide material 334 of the semiconductor device wafer 300 proximate to the front side 324 of the semiconductor layer 318. As such, SPAD region reflecting structure 332 redirects light 344 that has propagated through SPAD 310 unabsorbed back into the semiconductor layer 318 and into SPAD 310.

As can be appreciated in the cross-sectional example illustrated in FIG. 3, the guard ring region reflecting structure 330 is non-coplanar with the SPAD region reflecting structure 332 in order for light 344 (entering SPAD region 328) as well as light 346 (entering guard ring region 326) to redirected into SPAD 310 in accordance with the teachings of the present invention. For instance, as shown in the illustrated example, the plurality of metal layers M1, M2, M3 of the guard ring region reflecting structure 330 are arranged in an upside-down (or right side up, depending on one's perspective) flat-topped pyramid shape in the oxide material 334. In that example, the metal layer M4 of the SPAD region reflecting structure 332 is the "flat top" of the pyramid shaped structure, while the sides of the pyramid shaped structure form the guard ring region reflecting structure 330. It is appreciated of course that other suitable non-coplanar three dimensional structures, such as for example domed structures or the like, may be formed in the metal layers M1, M2, M3, M4, etc. of semiconductor wafer 300 to implement guard ring region reflecting structure 330 and SPAD region reflecting structure 332 to redirect light 346 and light 344 in accordance with the teachings of the present invention.

Figure 4:
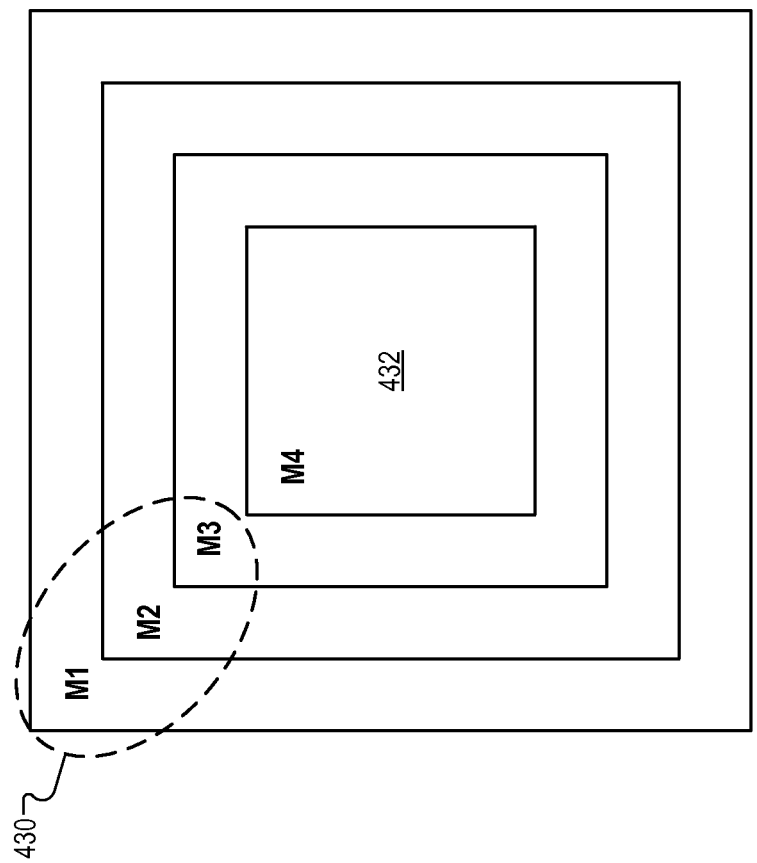
FIG. 4 is a bottom/top view of one example of a guard ring region reflecting structure in addition to an example SPAD region reflecting structure included in metal layers of a semiconductor device wafer of a stacked chip system in accordance with the teachings of the present invention.

FIG. 4 is a bottom/top view of one example of a guard ring region reflecting structure 430 in addition to an example SPAD region reflecting structure 432 included in metal layers of a semiconductor device wafer of a stacked chip system in accordance with the teachings of the present invention. It is appreciated that guard ring region reflecting structure 430 in addition to an example SPAD region reflecting structure 432 of FIG. 4 may be one example of guard ring region reflecting structure 330 in addition to an example SPAD region reflecting structure 332 of FIG. 3, and that similarly named and numbered elements referenced below are coupled and function similar to as described above.

As shown in the depicted example, SPAD region reflecting structure 432 of FIG. 4 is implemented with a single metal layer M4, and guard ring region reflecting structure 430 is implemented with multiple metal layers M1, M2, and M3. In the example, the plurality of metal layers M1, M2, M3, and M4 are disposed in an oxide material 434 proximate to a semiconductor layer that includes a SPAD. In the example, the SPAD region reflecting structure 432 is disposed in a SPAD region directly beneath the SPAD to redirect any light that passes through the SPAD unabsorbed back into the SPAD. In the example, the guard ring region reflecting structure 430 is disposed in the guard ring region surrounding the SPAD to redirect light that bypasses the SPAD and enters the guard ring region surrounding the SPAD back into the SPAD in accordance with the teachings of the present invention.

FIG. 5 is a block diagram showing one example of stacked chip integrated circuit imaging sensor system 502 in accordance with the teachings of the present invention. It is appreciated that stacked chip system 502 of FIG. 5 may be one example of an implementation of stacked chip system 102 of FIG. 1 and/or stacked chip system 202 of FIG. 2 and/or stacked chip system 302 of FIG. 3, and that similarly named and numbered elements referenced below are coupled and function similar to as described above. As shown in the example depicted in FIG. 5, stacked chip integrated circuit imaging sensor system 502 includes pixel array 536 coupled to control circuitry 542 and readout circuitry 538, which is coupled to function logic 540.

In one example, pixel array 536 is a two-dimensional (2D) array of pixel cells (e.g., pixel cells P1, P2 ..., Pn). In one example, each pixel cell includes a photon detector having a SPAD surrounded by a guard ring with a guard ring region reflector structure as discussed above. For instance, it is noted that the pixel cells P1, P2, ... Pn in the pixel array 536 may be examples of $PIXEL_1$, $PIXEL_2$, ... $PIXEL_N$ of FIG. 2 and that similarly named and numbered elements referenced below are coupled and function similar to as described above. As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc. In another example, pixel array 536 may also be used in timing mode to give a "time image" of a scene, which may be used in time of flight applications for range information or fluorescence lifetime for medical applications.

Output pulses generated by the SPADs of pixel array 536 are readout by high readout circuitry 538 and transferred to function logic 540. In one example, readout circuitry 538 includes at least one counter circuit for each of the SPADs in pixel array 536 and can also include amplification circuitry and/or quenching circuitry. Function logic 540 can simply store image data in memory or even manipulate the image data by applying post image effects (e.g., crop, rotate, adjust brightness, adjust contrast, or otherwise). Control circuitry 542 is coupled to pixel array 536 and/or to readout circuitry 538 to control operational pixel array 536. For example, control circuitry 542 may simultaneously enable each of the counter circuits included in readout circuitry 538 for a window of time so as to implement a global shutter operation. Accordingly, examples of the SPAD stacked chip image sensor, discussed herein, provide for imaging that is both high speed and low light sensitive, which is typically not achieved with conventional sensor architectures.

In one example, imaging sensor system 502 illustrated in FIG. 5 may be implemented in a stacked chip scheme. For instance, in one example, pixel array 536 may be included in a pixel die, while readout circuitry 538, function logic 540, and control circuitry 542, as illustrated in FIG. 5, may be included in a separate ASIC die in accordance with the teachings of the present invention. In the example, the pixel die and ASIC die are stacked and coupled together during fabrication to implement a imaging sensor system in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A photon detector, comprising:
    a single photon avalanche diode (SPAD) disposed proximate to a front side of a first semiconductor layer, wherein the SPAD includes a multiplication junction defined at an interface between an n doped layer and a p doped layer of the SPAD in the first semiconductor layer, wherein the multiplication junction is reversed biased above a breakdown voltage such that light directed into the SPAD through a backside of the first semiconductor layer triggers an avalanche multiplication process in the multiplication junction;
    a guard ring disposed in the first semiconductor layer in a guard ring region proximate to the SPAD, wherein the guard ring surrounds the SPAD to isolate the SPAD in the first semiconductor layer;
    a guard ring region reflecting structure disposed in the guard ring region proximate to the guard ring and proximate to the front side of the first semiconductor layer such that light directed into the guard ring region through the backside of the first semiconductor layer that bypasses the SPAD is redirected by the guard ring region reflecting structure back into the first semiconductor layer and into the SPAD; and
    a SPAD region reflecting structure disposed proximate to the SPAD and proximate to the front side of the first semiconductor layer such that light directed into the first semiconductor layer through the backside of the first semiconductor layer that passes through the SPAD is reflected by the SPAD region reflecting structure back into the first semiconductor layer and into the SPAD, wherein the guard ring region reflecting structure is non-coplanar with the SPAD region reflecting structure.

2. The photon detector of claim 1 wherein the guard ring region reflecting structure comprises a plurality of metal layers disposed in an oxide material disposed proximate to the front side of the first semiconductor layer.

3. The photon detector of claim 2 wherein the SPAD region reflecting structure is included in one of the plurality of metal layers disposed in the oxide material disposed proximate to the front side of the first semiconductor layer.

4. The photon detector of claim 3 wherein the plurality of metal layers of the guard ring region reflecting structure are arranged in a flat-topped pyramid shape in the oxide material disposed proximate to the front side of the first semiconductor layer.

5. The photon detector of claim 4 wherein the guard ring region reflecting structure is included in a first, a second, and a third one of the plurality of metal layers, and wherein the SPAD region reflecting structure is included in a fourth one of the plurality of metal layers.

6. The photon detector of claim 1 wherein the first semiconductor layer includes thinned silicon.

7. The photon detector of claim 1 wherein the light includes near infrared light.

8. The photon detector of claim 1 wherein the first semiconductor layer is included in a first semiconductor device wafer, wherein the first semiconductor device wafer is stacked with a second semiconductor device wafer including readout circuitry, and wherein the first and second semiconductor device wafer are coupled together in a stacked chip system.

9. The photon detector of claim 5, wherein the first, the second, and the third one of the plurality of metal layers each form a closed loop, and wherein the fourth one of the plurality of metal layers is a flat top of the flat-topped pyramid shape.

10. The photon detector of claim 2, wherein individual metal layers in the plurality of metal layers are laterally staggered.

11. The photon detector of claim 10, wherein a majority of each individual metal layer is optically misaligned with other individual metal layers in the plurality of metal layers.

12. The photon detector of claim 2, wherein individual metal layers in the plurality of metal layers are surrounded by the oxide material and are electrically isolated from one another.

13. The photon detector of claim 1, wherein the guard ring region reflecting structure is non-coplanar with the SPAD region reflecting structure in both a vertical direction and a lateral direction, wherein the vertical direction is surface normal to the front side of the first semiconductor layer and the lateral direction is orthogonal to the vertical direction.

14. The photon detector of claim 1, wherein the guard ring region reflecting structure is rectangular with a center of each rectangle removed, and wherein the SPAD region reflecting structure is rectangular.

15. The photon detector of claim 8, wherein the guard ring region reflecting structure and the SPAD region reflecting structure are electrically isolated from the readout circuitry.

* * * * *